United States Patent

Shinoda et al.

[15] 3,699,408

[45] Oct. 17, 1972

[54] GALLIUM-ARSENIDE SCHOTTKY BARRIER TYPE SEMICONDUCTOR DEVICE

[72] Inventors: Daizaburo Shinoda; Masaoki Ishikawa, both of Tokyo, Japan

[73] Assignee: Nippon Electric Company, Limited, Tokyo, Japan

[22] Filed: Jan. 20, 1971

[21] Appl. No.: 108,125

[30] Foreign Application Priority Data

Jan. 23, 1970 Japan ........................45/6658
Jan. 23, 1970 Japan ........................45/6659

[52] U.S. Cl....................................317/237, 317/234
[51] Int. Cl. ...............................................H01l 3/20
[58] Field of Search..............................317/234, 237

[56] References Cited

UNITED STATES PATENTS

| | | | |
|---|---|---|---|
| 3,506,893 | 4/1970 | Dhaka | 317/235 |
| 3,516,021 | 6/1970 | Kohn | 331/117 |
| 3,585,469 | 6/1971 | Jager | 317/234 |

*Primary Examiner*—James D. Kallam
*Attorney*—Sandoe Hopgood and Calimafde

[57] ABSTRACT

A Shottky barrier diode includes a GaAs epitaxial wafer. A Pt-Ni alloy is used as the contact metal to form the Schottky barrier, and an additional alloy layer is formed in the boundary between the Pt-Nl alloy and the GaAs wafer to increase the bonding strength between the wafer and the alloy.

3 Claims, 5 Drawing Figures

*INVENTORS*
DAIZABURO SHINODA
MASAOKI ISHIKAWA by
Sandoe, Hopgood & Calimafde
ATTORNEYS

GALLIUM-ARSENIDE SCHOTTKY BARRIER TYPE SEMICONDUCTOR DEVICE

This invention relates generally to semiconductors, and more particularly to a Schottky barrier type semiconductor device and its method of manufacture.

In a Schottky barrier diode which is a fundamental Schottky barrier type semiconductor device, majority carriers rather than minority carriers take part of the rectifying function and, therefore, the cut-off frequency of the diode depends on the barrier capacitance and series resistance, rather than on the life of the minority carriers. For this reason the Schottky barrier diode is widely used as a high speed switching diode or a microwave diode. Higher cutoff frequency can be obtained in the gallium arsenide Schottky barrier diode than in the silicon Schottky barrier diode. GaAs Schottky barrier diodes are thus indispensable for use in high frequency apparatus. In general, the rectifying barrier of a Schottky barrier diode is a region where a metal is in contact with a semiconductor. Therefore, the characteristics of this type of diode are greatly affected by the surface condition of the semiconductor onto which the metal is to be attached, and are not stable against ambient conditions and operating temperature. Thus, the conventional Schottky barrier diodes lack reliability.

The object of this invention is therefore to provide a highly reliable and easily manufacturable GaAs Schottky barrier type semiconductor device.

Another object of this invention is to provide a GaAs Schottky barrier type semiconductor device having high reproducibility and capable of maintaining its characteristics without being affected by manufacturing and operating conditions.

A further object of this invention is to provide a method of producing a GaAs Schottky barrier type semiconductor device having stable characteristics.

The GaAs Schottky barrier type semiconductor device of this invention is manufactured by attaching a Pt-Ni alloy of 10 to 50 weight percent of the Ni content to a GaAs wafer and heating the Pt-Ni-attached GaAs wafer to form an alloyed layer containing Pt, Ni, Ga and As in the boundary by solid-solid reaction between GaAs and Pt-Ni alloy. In this device, a Schottky barrier is formed between the alloyed boundary layer and GaAs. Therefore, the characteristics of the semiconductor device of this invention are not appreciably affected by the surface condition of the n-type GaAs wafer onto which the Pt-Ni alloy is to be attached. In addition, the Schottky barrier formed by the process of this invention is stable against thermal and mechanical shock. Thus, a highly reliable Schottky barrier device is obtained.

The composition of the alloyed boundary layer has not yet been precisely determined, but it is believed that this layer contains various types of alloys such as GaPt, $Ga_2Pt$ and $PtAs_2$. The heat treatment for forming the alloyed boundary layer should be carried out in hydrogen ambient or in vacuum at a temperature of 400° to 500°C for a duration of 20 minutes or less. The optimum duration of the heat treatment depends on the heating temperature. The duration should be made shorter as the heating temperature becomes higher. For instance, a ten minute period is optimum for heating, at 500°C. heating. By adjusting the conditions of the heat treatment and the composition of the Pt-Ni alloy, it is possible to control the thickness of the alloyed boundary layer. Thus, the pinch-off voltage of a Schottky barrier gate type field effect transistor fabricated in accordance with this invention can be readily controlled.

The invention will be better understood from the following description taken in connection with the accompanying drawings in which.

Figure 1:
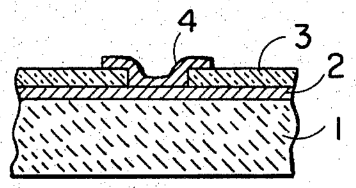
(Prior Art) FIG. 1
FIG. 1 is a sectional view showing the structure of a conventional Schottky barrier diode.

Referring to FIG. 1, there is shown a conventional Schottky barrier diode. This diode is composed of a GaAs wafer having a low resistive GaAs substrate 1 and an n-type epitaxially-grown layer 2 of a specific resistance of 0.1 to 0.02 ohm-cm. An insulative surface protection film 3 is then formed on the epitaxial layer 2 and a specific part of the film 3 is removed to expose a clean surface of the GaAs wafer by chemical treatment. Then a metal member 4 such as molybdenum, titanium or nickel, is evaporated over the exposed clean surface of layer 2 in an atmosphere of high vacuum below $10^{-7}$ mmHg.

In the Schottky barrier diode of FIG. 1, the metal 4 is simply evaporated onto the GaAs epitaxial layer 2 and, therefore, this semiconductor device tends to have various defects. For example, the electrical characteristics of the diode are easily affected by the surface condition of the GaAs epitaxial layer 2 on which the metal 4 is evaporated. Thermal interaction is liable to take place between the metal 4 and GaAs epitaxial layer 2 at the operating temperature. Accordingly, the electrical characteristics of the Schottky barrier are easily affected by the operating temperature. Furthermore, the strength of the mechanical contact between the metal 4 and GaAs epitaxial layer 2 is quite insufficient because the metal 4 is simply evaporated onto the epitaxial layer 2. In short, the electrical characteristics of a conventional Schottky barrier diode is easily affected by the surface condition of the GaAs layer and the operating conditions, and the reproducibility in manufacturing this Schottky barrier diode is low.

Figure 2:
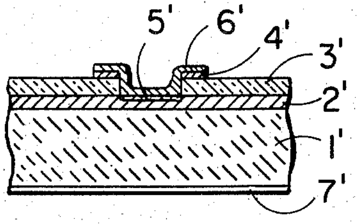
FIG. 2 is a sectional view showing the structure of a Schottky barrier diode embodying this invention.

Referring now to FIG. 2, there is illustrated a sectional view of the structure of an example of a Schottky barrier diode embodying this invention. This Schottky barrier diode is manufactured through the following process: An n-type GaAs epitaxial layer 2′ having a specific resistance of 0.1 to 0.02 ohm-cm is formed on a low resistive GaAs substrate 1′ having a specific resistance of less than $1 \times 10^{-3}$ ohm-cm. Thus, a GaAs wafer is formed having the substrate 1′ and the epitaxial layer 2′. An insulative surface protection film 3′ is then attached to the surface of the wafer, and a thin titanium film 4′ is then attached to the surface protection film 3′. Then, a specific part of the surface protection film 3′ and of the titanium film 4′ is removed to expose a clean surface of the wafer by chemical treatment. A Pt-Ni alloy film 6′ containing 10 to 50 percent by weight of nickel is evaporated onto the surface of the element to a thickness of 1,000 to 2,000A in an atmosphere of a high vacuum below $10^{-7}$ mmHg. After evaporation, the element is subjected to heat treatment for 20 minutes or less at a temperature ranging from 400° to 500° C in vacuum or in hydrogen gas, whereby an alloyed layer 5′ is formed in the boundary plane between the Pt-Ni alloy film 6′ and the GaAs wafer. Then, the unnecessary part of Pt-Ni alloy film 6′ which has not been subjected to reaction is removed by chemical treatment, and an ohmic electrode is attached thereto. An electrode 7′ may be attached to the lower surface of substrate 1′, if desired, as shown in FIG. 2.

The first feature of this invention lies in that the alloy of GaAs and Pt-Ni alloy containing 10 to 50 percent by weight of nickel is used instead of pure metal for the contact metal which is used to form the Schottky barrier. The second feature of the invention lies in that an additional alloy layer is formed in the boundary between the Pt-Ni alloy and the GaAs wafer by heat treatment. Accordingly, the electrical characteristics of the Schottky barrier diode of this invention are not appreciably affected by the surface condition of GaAs to which the alloy 6′ is to be evaporated, but are kept constant. Also, the Schottky barrier diode of this invention has good reproducibility. According to this invention, the bonding strength between the GaAs wafer and the Pt-Ni alloy is great because an additional alloy layer is formed in the boundary plane of the Pt-Ni alloy and the GaAs layer by reacting with each other. The characteristic of this alloy layer is stable in a wide temperature range in comparison with the prior art.

The reason why the nickel content in the Pt-Ni alloy is determined in the range from 10 to 50 percent by weight is because when the content of nickel is lower than 10 percent by weight, the interface reaction slows down or stops in heat treatment, and when it is higher than 50 percent by weight the breakdown voltage is lowered. This has been derived from experimental results.

Figure 3:
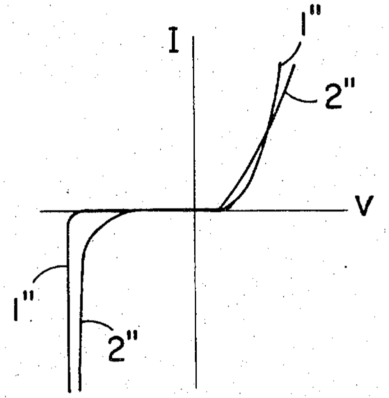
FIG. 3 is a diagram illustrating the current-voltage characteristic of a Schottky barrier diode of this invention in comparison with the prior art.

FIG. 3 shows an example of the current vs. voltage characteristic of the Schottky barrier diode of this invention as compared to the prior art diode of FIG. 1. As will be apparent from FIG. 3, the characteristic 1″ of the Schottky barrier diode of this invention has a lower series resistance and a higher forward current flow than the conventional diode which has a characteristic 2″. The Schottky barrier diode of this invention has a smaller reverse leakage current and a higher breakdown voltage in comparison with the conventional one. A remarkable result that has been obtained in the reliability test in high temperature at 200°C is that the diode of this invention showed no deterioration in the breakdown voltage, and that the rate of fabrication of defective products was below one-tenth that of the conventional one. The result of the burn-out rating test on the diode reveals that the entire sample lot of the conventional Schottky barrier diode is deteriorated in the breakdown voltage at 0.2 erg, whereas the diode of this invention maintained a high breakdown voltage even at 0.5 erg. in the test. Thus, the Schottky barrier diode obtained according to this invention has exceptionally high reliability.

Figure 4:
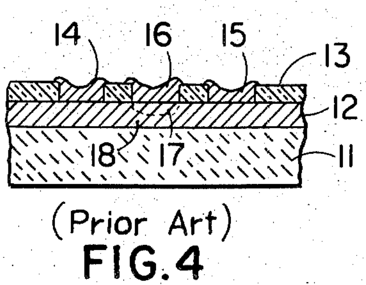
(Prior Art) FIG. 4
FIG. 4 is a sectional view showing a conventional Schottky barrier field effect transistor.

Another embodiment of this invention in connection with a Schottky barrier gate type field effect transistor (hereinafter briefly SBG type FET) now will be described referring to FIGS. 4 through 6.

An n-type GaAs epitaxial grown layer 12 having an impurity concentration of about $10^{16}$ is formed on the surface of a semi-insulative GaAs substrate 11, and an insulative surface protection film 13 is disposed on the surface of the epitaxially grown layer 12. A specific part of the protection film 13 is removed by a photomask etching technique, and the surface of the GaAs epitaxial layer is cleaned by chemical treatment. Immediately after this process, an Au-Ge alloy is evaporated onto the cleaned surface in an atmosphere of a high vacuum below $10^{-5}$ mmHg, and ohmic connection between the Au-Ge alloy and GaAs layer is formed by suitable heat treatment, to provide a source electrode 14 and a drain electrode 15. Then, part of the protection film 13 (the part corresponding to the gate electrode) is removed, a metal 16 such as aluminum is evaporated thereonto, and a gate electrode 16 is provided.

As well-known, an SBG type FET is operated in the following manner. A negative bias voltage is applied to the gate electrode to form a Schottky barrier and thus to change the width of a depletion layer 17, whereby the conductance of a channel layer 18 located between the source and drain is changed.

When an SBG type FET is put into practical use, such as in a logic circuit, it is desirable to make the pinch-off voltage Vp as low as possible in order to reduce the power consumption of the circuit. To control the pinch-off voltage Vp in the prior art device, the thickness of the epitaxial layer had to be controlled according to its growing condition or by a chemical etching technique. However, when GaAs is used as the semiconductor substrate material of the SBG type FET, the pinch-off voltage Vp can hardly be controlled by conventional techniques because the impurity concentration distribution in the epitaxial layer is not uniform.

Furthermore, such SBG type FET has in its gate area the same drawbacks as in the conventional Schottky barrier diode mentioned above.

Figure 5:
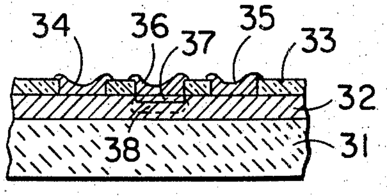
FIG. 5 is a sectional view showing a Schottky barrier gate type field effect transistor embodying this invention.

Referring to FIG. 5, there is illustrated a GaAs SBG type FET embodying this invention, which is constituted in the following manner. A low resistive GaAs epitaxial grown layer 32 is formed on a semi-insulative GaAs substrate 31, and then is coated with an insulative protection film 33. A specific part of the protection film 33 is removed to expose a clean surface of GaAs by chemical treatment. Immediately after this process, an indium(In)-germanium(Ge)-silver(Ag) alloy is evaporated thereonto in an atmosphere of a high vacuum below $10^{-5}$mmHg, and an ohmic contacting source electrode 34 and a drain electrode 35 are formed by a relatively brief heat treatment at a temperature of 550° to 600°C. Then, part of the insulation protection film 33 (the part corresponding to the gate region) is removed to expose a clean surface of GaAs epitaxial layer 32 by chemical treatment, and a platinum-nickel alloy 36 containing 10 to 50 percent by weight of nickel is evaporated onto the clean surface in an atmosphere of a high vacuum below $10^{-5}$mmHg. The unnecessary portion of the Pt-Ni alloy is removed by a photomask etching technique. Then heat treatment is applied to the element at a temperature between 400° and 500°C in a hydrogen atmosphere. As a result, a reaction is brought about in the boundary plane between GaAs epitaxial layer 32 and Pt-Ni alloy 36, thereby forming an additional alloy layer 37. Alloy layer 37 serves to form a Schottky barrier to a height of 0.90eV with respect to the GaAs layer. As a result, a depletion layer 38 is formed in the GaAs epitaxial layer, and a SBG type FET is formed.

The thickness of the alloy layer 37 can be suitably controlled according to the condition of the heat treatment. For example, when a Pt-Ni alloy containing 20 percent of nickel is used, the thickness of the additional alloy layer 37 after heat treatment for 5 minutes at 450°C in the hydrogen atmosphere is about 1,000A, or the thickness thereof after heat treatment for ten minutes at 450°C is about 2,000A. The thickness of the additional alloy layer 37 after a five minute heat treatment at 500°C is about 2,500A. The thickness of the alloy layer differs according to the composition ratio of the Pt-Ni alloy. Under the same heat treatment condition, the more the content of nickel, the thicker will become the alloy layer.

The thickness of the additionally formed alloy can be controlled in the manner described above. Accordingly, the pinch-off voltage Vp can be easily controlled through a repetition of the heat treatment as by measuring the characteristics of the actual SBG type FET.

In the above described embodiments, semi-insulative GaAs is used for the substrate on which an epitaxial grown GaAs wafer is formed. Instead, an insulative material such as sapphire or GaAs wafer using p-type GaAs may be used. It will be apparent that the principle of this invention is applicable regardless of the structure of GaAs wafer used.

While a few specific embodiments of the invention and particular modifications thereof have been described in detail, it is clearly understood that the invention is not limited thereto or thereby.

What is claimed is:

1. A gallium-arsenide Schottky barrier type semiconductor device comprising a gallium-arsenide wafer, a layer of platinum-nickel alloy attached to said wafer, and a reaction layer between said gallium-arsenide wafer and said platinum-nickel alloy layer, wherein a Schottky barrier is formed between said wafer and said reaction layer.

2. The gallium-arsenide Schottky barrier type semiconductor device as defined in claim 1, wherein said gallium-arsenide wafer is of n-conductivity type and wherein said platinum-nickel alloy contains 10 to 50 percent by weight of nickel.

3. A gallium-arsenide Schottky barrier field effect transistor comprising an n-conductivity type gallium-arsenide wafer, source and drain electrodes ohmically attached to one surface of said wafer and separated from each other, and a gate electrode attached to an area of the surface of said wafer between said source and drain electrodes, said gate electrode consisting of a layer of platinum-nickel alloy containing 10 to 50 percent by weight of nickel and a reaction layer between said wafer and said platinum-nickel alloy layer.

* * * * *